United States Patent
Weksler et al.

(10) Patent No.: US 9,691,503 B2
(45) Date of Patent: Jun. 27, 2017

(54) ALLOCATION TECHNIQUE FOR MEMORY DIAGNOSTICS

(71) Applicant: LENOVO (Singapore) PTE, LTD., New Tech Park (SG)

(72) Inventors: Arnold S. Weksler, Raleigh, NC (US); Maurício de Moraes Barros Neto, Sorocaba (BR); Rafael Rodrigues Machado, Sorocaba (BR); Fernando José Vieira da Silva, Tatui (BR); Fernando Ferraz Silva, Sorocaba (BR); Dênis Alberto Silverio, Sorocaba (BR); Rafael Teodoro, Sorocaba (BR)

(73) Assignee: Lenovo (Singapore) PTE. LTD., New Tech Park (SG)

( * ) Notice: Subject to any disclaimer, the term of this patent is extended or adjusted under 35 U.S.C. 154(b) by 533 days.

(21) Appl. No.: 14/229,478

(22) Filed: Mar. 28, 2014

(65) Prior Publication Data
US 2015/0279483 A1 Oct. 1, 2015

(51) Int. Cl.
| | | |
|---|---|---|
| *G11C 29/18* | (2006.01) | |
| *G11C 29/00* | (2006.01) | |
| *G06F 3/06* | (2006.01) | |
| *G11C 29/04* | (2006.01) | |

(52) U.S. Cl.
CPC .......... *G11C 29/18* (2013.01); *G06F 3/0619* (2013.01); *G06F 3/0644* (2013.01); *G06F 3/0673* (2013.01); *G11C 2029/0409* (2013.01)

(58) Field of Classification Search
CPC combination set(s) only.
See application file for complete search history.

(56) References Cited

U.S. PATENT DOCUMENTS

| | | | | |
|---|---|---|---|---|
| 7,610,523 B1* | 10/2009 | Singh | ............ | G11C 29/42 365/200 |
| 7,802,158 B2* | 9/2010 | Borkenhagen | ... | G11C 29/56008 714/724 |
| 2014/0237208 A1* | 8/2014 | Colbert | ............ | G06F 11/2205 711/170 |

OTHER PUBLICATIONS

Allen C. Cheng, "Comprehensive Study on Designing Memory BITS: Algorithms, Implementations and Trade-offs", Digital System Testing Project Report, EECS 579, Dec. 16, 2002.
Michael Barr, "Fast Accurate Memory Test Suite", http://www.barrgroup.com/Embedded-Systems/How-To/Memory-Test-Suite-C, Jan. 30, 2014.
Marc Riedel et al., "Fault Coverage Analysis of RAM Test Algorithms", paradise.caltech.edu/~riedel/research/ramflt.ppt, Aug. 27, 2011.

(Continued)

*Primary Examiner* — Justin R Knapp
(74) *Attorney, Agent, or Firm* — Kunzler Law Group

(57) ABSTRACT

An apparatus for allocating computer memory for memory diagnostics is disclosed. The apparatus may include a processor and memory that stores code executable by the processor, and may include code that identifies an unreserved amount of memory in a computer system, code that requests a portion of the memory based on the unreserved amount of memory, and code that determines whether an allocated portion of the memory comprises non-contiguous memory addresses. In some embodiments, the apparatus includes code that locks the allocated portion of the memory in response to the allocated portion consisting solely of contiguous memory addresses, and code that performs a memory diagnostic test on the allocated portion of the memory.

20 Claims, 6 Drawing Sheets

(56) References Cited

OTHER PUBLICATIONS

L. Dilillo et al., "March iC-: An Improved Version of March C- for ADOFs Detection", VLSI Test Symposium, 2004. Proceedings. 22nd IEEE.
Ad J. Van De Goor, "Using March Tests to Test SRAMs", IEEE Design & Test of Computers, vol. 10, Issue 1, Mar. 1993.
"Memory Testing", University of Cincinnati—ECE, known about as early as Jan. 30, 2014.
Memory Testing, University of Toronto, ECE 1767, known about as early as Jan. 30, 2014.
"MemTest86 Technical Information", PassMark Software, Jan. 30, 2014.
Mudapu Paravathi et al., "Modified March C- Algorithm for Embedded Memory Testing", International Journal of Electrical and Computer Engineering, vol. 2, No. 5, Oct. 2012, pp. 571-576.
Cheng-Wen Wu, "Testing Semiconductor Memories", Lab for Reliable Computing Dept. Electrical Engineering National Tsing Hua University, Jun. 2011.

\* cited by examiner

ALLOCATION TECHNIQUE FOR MEMORY DIAGNOSTICS

BACKGROUND

Field

The subject matter disclosed herein relates to memory diagnostics and more particularly relates to computer memory allocation techniques for memory test diagnostics.

Description of the Related Art

An ideal memory diagnostic should be capable of checking all memory addresses in a computer system in order to be sure there is no defective cell. However, this is not possible by practical means since the diagnostic application itself occupies memory space with its own code. Further, when running a memory diagnostic over an operating system (OS), such as Windows or Linux, this problem is bigger since the OS may use a huge amount of memory for itself. Additionally, other applications may run at the same time as the memory diagnostic application, for example when the computer system is a server. In addition, the memory diagnostic must also deal with fragmented memory. Further, existent diagnostics that run on some operating systems allocate shared memory regions, which have no guarantee to not be paged to disk.

BRIEF SUMMARY

An apparatus for allocating computer memory for memory diagnostics is disclosed. A method and computer program product also perform the functions of the apparatus.

The apparatus may include a processor and memory that stores code executable by the processor, the code including code that identifies an unreserved amount of memory in a computer system, code that requests a portion of the memory based on the unreserved amount of memory, and code that determines whether an allocated portion of the memory comprises non-contiguous memory addresses.

The method may include identifying, by use of a processor, an unreserved amount of memory in a computer system, requesting a portion of the memory based on the unreserved amount of memory, and determining whether an allocated portion of the memory includes non-contiguous memory addresses.

The computer program product may include a computer readable storage medium that stores code executable by a processor to identify an unreserved amount of memory in a computer system, requesting a portion of the memory based on the unreserved amount of memory, determining whether an allocated portion of the memory comprises non-contiguous memory addresses, and performing a memory diagnostic test on the allocated portion of the memory in response to the allocated portion consisting solely of contiguous memory addresses.

BRIEF DESCRIPTION OF THE DRAWINGS

A more particular description of the embodiments briefly described above will be rendered by reference to specific embodiments that are illustrated in the appended drawings. Understanding that these drawings depict only some embodiments and are not therefore to be considered to be limiting of scope, the embodiments will be described and explained with additional specificity and detail through the use of the accompanying drawings, in which.

DETAILED DESCRIPTION

Figure 1:
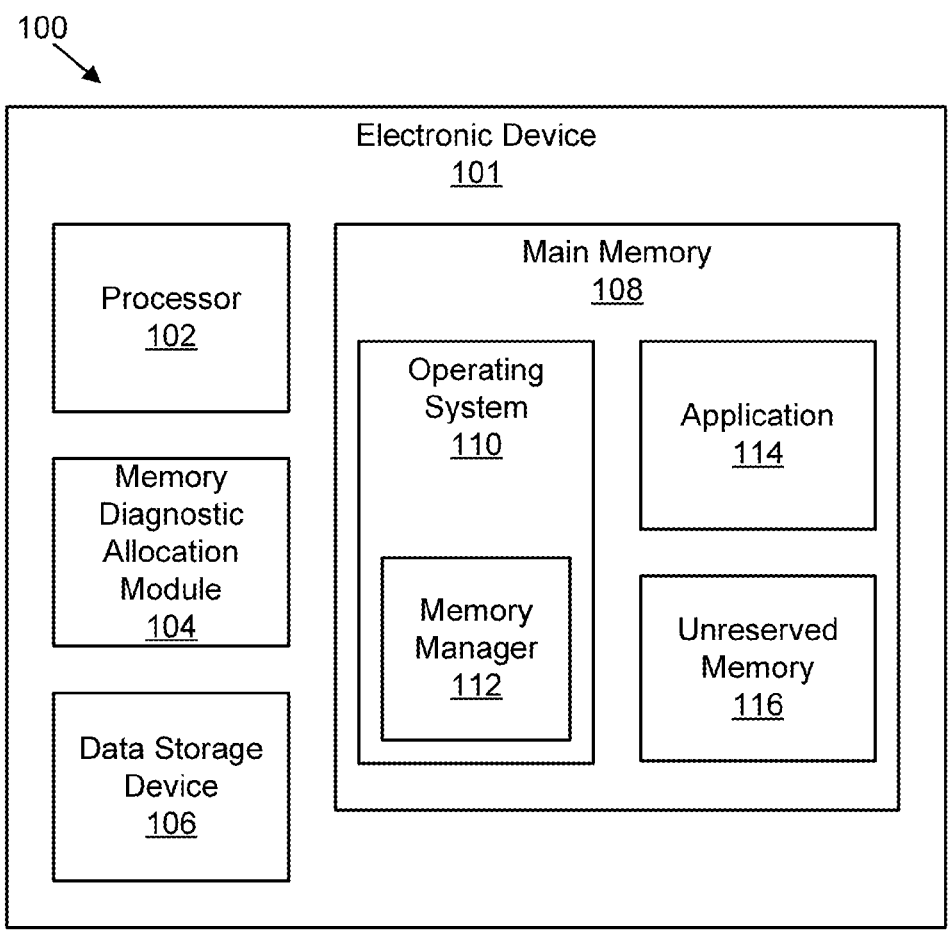
FIG. 1 is a schematic block diagram illustrating one embodiment of a system for allocating computer memory for memory diagnostics.

As will be appreciated by one skilled in the art, aspects of the embodiments may be embodied as a system, method or program product. Accordingly, embodiments may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, embodiments may take the form of a program product embodied in one or more computer readable storage devices storing machine readable code, computer readable code, and/or program code, referred hereafter as code. The storage devices may be tangible, non-transitory, and/or non-transmission. The storage devices may not embody signals. In a certain embodiment, the storage devices only employ signals for accessing code.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in code and/or software for execution by various types of processors. An identified module of code may, for instance, comprise one or more physical or logical blocks of executable code which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different computer readable storage devices. Where a module or portions of a module are implemented in software, the software portions are stored on one or more computer readable storage devices.

Any combination of one or more computer readable medium may be utilized. The computer readable medium may be a computer readable storage medium. The computer readable storage medium may be a storage device storing the code. The storage device may be, for example, but not limited to, an electronic, magnetic, optical, electromagnetic, infrared, holographic, micromechanical, or semiconductor system, apparatus, or device, or any suitable combination of the foregoing.

More specific examples (a non-exhaustive list) of the storage device would include the following: an electrical connection having one or more wires, a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Code for carrying out operations for embodiments may be written in any combination of one or more programming languages, including an object oriented programming language such as Java, Smalltalk, C++ or the like and conventional procedural programming languages, such as the "C" programming language or similar programming languages. The code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to," unless expressly specified otherwise. An enumerated listing of items does not imply that any or all of the items are mutually exclusive, unless expressly specified otherwise. The terms "a," "an," and "the" also refer to "one or more" unless expressly specified otherwise.

Furthermore, the described features, structures, or characteristics of the embodiments may be combined in any suitable manner. In the following description, numerous specific details are provided, such as examples of programming, software modules, user selections, network transactions, database queries, database structures, hardware modules, hardware circuits, hardware chips, etc., to provide a thorough understanding of embodiments. One skilled in the relevant art will recognize, however, that embodiments may be practiced without one or more of the specific details, or with other methods, components, materials, and so forth. In other instances, well-known structures, materials, or operations are not shown or described in detail to avoid obscuring aspects of an embodiment.

Aspects of the embodiments are described below with reference to schematic flowchart diagrams and/or schematic block diagrams of methods, apparatuses, systems, and program products according to embodiments. It will be understood that each block of the schematic flowchart diagrams and/or schematic block diagrams, and combinations of blocks in the schematic flowchart diagrams and/or schematic block diagrams, can be implemented by code. These code may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the schematic flowchart diagrams and/or schematic block diagrams block or blocks.

The code may also be stored in a storage device that can direct a computer, other programmable data processing apparatus, or other devices to function in a particular manner, such that the instructions stored in the storage device produce an article of manufacture including instructions which implement the function/act specified in the schematic flowchart diagrams and/or schematic block diagrams block or blocks.

The code may also be loaded onto a computer, other programmable data processing apparatus, or other devices to cause a series of operational steps to be performed on the computer, other programmable apparatus or other devices to produce a computer implemented process such that the code which execute on the computer or other programmable apparatus provide processes for implementing the functions/acts specified in the flowchart and/or block diagram block or blocks.

The schematic flowchart diagrams and/or schematic block diagrams in the Figures illustrate the architecture, functionality, and operation of possible implementations of apparatuses, systems, methods and program products according to various embodiments. In this regard, each block in the schematic flowchart diagrams and/or schematic block diagrams may represent a module, segment, or portion of code, which comprises one or more executable instructions of the code for implementing the specified logical function(s).

It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated Figures.

Although various arrow types and line types may be employed in the flowchart and/or block diagrams, they are understood not to limit the scope of the corresponding embodiments. Indeed, some arrows or other connectors may be used to indicate only the logical flow of the depicted embodiment. For instance, an arrow may indicate a waiting or monitoring period of unspecified duration between enumerated steps of the depicted embodiment. It will also be noted that each block of the block diagrams and/or flowchart diagrams, and combinations of blocks in the block diagrams and/or flowchart diagrams, can be implemented by special purpose hardware-based systems that perform the specified functions or acts, or combinations of special purpose hardware and code.

The description of elements in each figure may refer to elements of proceeding figures. Like numbers refer to like elements in all figures, including alternate embodiments of like elements.

Generally, the disclosed systems, apparatuses, methods, and computer program products identify an unreserved amount of system memory, request a portion of system memory based on the unreserved amount, and determine if a memory allocation (e.g., an allocated portion of the system memory) includes non-contiguous memory addresses and/or virtual memory. After determining that no non-contiguous memory addresses and/or virtual memory are included the memory allocation, a memory diagnostic test may be performed on the allocated portion of the system memory.

The system memory typically includes an array of memory cells, each storing a data value, which may be affected by electric issues, such as short or open circuits. Electrical problems in the system memory prevent correct data storage and/or access, thereby causing several different memory storage errors (i.e., memory faults). These faults include stuck-at faults (where a memory cell always holds the same value), transition faults (where a memory cell fails to undergo a value transition), coupling faults (where a write operation to one memory cell affects a value stored in an adjacent cells), data retention faults (where a memory cell loses its value over time due to power leaks), read random faults (where a memory cell returns a random value when read), and addressing faults (where multiple memory cells may be accessed through the same address, multiple addresses may point to the same cell, or a cell may never be accessed). Memory faults can prevent instructions from being properly executed and/or corrupt data values leading to system instability and crashes, thereby preventing a computing device from functioning as designed. It is, therefore, desirable to test for faults and, where possible, to remedy them.

The apparatuses may include a processor and memory that stores code executable by the processor, the code including code that identifies an unreserved amount of memory in a computer system, code that requests a portion of the memory based on the unreserved amount of memory, and code that determines whether an allocated portion of the memory includes non-contiguous memory addresses. The code that determines whether an allocated portion of the memory includes non-contiguous memory addresses may comprise the code that allocates the allocated portion into a single buffer. The code that identifies an unreserved amount of memory may include the code that queries an operating system to identify locked memory.

In some embodiments, the apparatuses include code that locks the allocated portion of the memory in response to the allocated portion consisting solely of contiguous memory addresses, and code that performs a memory diagnostic test on the allocated portion of the memory.

In some embodiments, the apparatuses include code that determines a testable amount of memory that is less than the unreserved amount of memory, wherein the code that requests a portion of the memory comprises code that requests the testable amount of the memory. In some embodiments, the apparatuses include code that determines whether the allocated portion comprises virtual memory, code that releases the allocation in response to the allocated portion comprising virtual memory, and code that requests a second portion of the memory based on the unreserved amount of memory, wherein the second portion of memory is less than the allocated portion of memory.

In some embodiments, the apparatuses include code that releases the allocated portion of the memory in response to the allocated portion comprising non-contiguous memory addresses, and code that requests a second portion of the memory based on the unreserved amount of memory. The code that requests a second portion of the memory may include code that determines a testable block of memory, code that calculates a number of testable blocks that will fit in the second portion of memory, and code that requests the number of testable blocks.

The methods may include identifying, by use of a processor, an unreserved amount of memory in a computer system, requesting a portion of the memory based on the unreserved amount of memory, and determining whether an allocated portion of the memory includes non-contiguous memory addresses. In certain embodiments, the methods includes locking the allocated portion of the memory in response to the allocated portion consisting solely of contiguous memory addresses, and performing a memory diagnostic test on the allocated portion of the memory. Identifying an unreserved amount of memory may include querying an operating system to identify locked memory. Determining whether an allocated portion of the memory includes non-contiguous memory addresses may involve allocating the allocated portion into a single buffer.

In some embodiments, the methods include releasing the allocated portion of the memory in response to the allocated portion comprising non-contiguous memory addresses, determining a testable block of memory, calculating a number of testable blocks that will fit in the allocated portion of memory, and requesting the number of testable blocks. In some embodiments, the methods include determining a testable amount of memory less than the unreserved amount of memory, wherein requesting a portion of the memory comprises requesting the testable amount of the memory.

In some embodiments, the methods include determining whether the allocated portion of the memory comprises virtual memory, releasing the allocated portion of the memory in response to the allocated portion comprising virtual memory, and requesting a second portion of the memory based on the unreserved amount of memory. Requesting the second portion of the memory may include determining a testable block of memory, calculating a number of testable blocks that will fit in the second portion of memory, and requesting the number of testable blocks. Requesting the second portion of the memory may include requesting an additional amount of memory equal to the difference between the second portion of memory and a sum of the testable blocks.

The computer program products may include a computer readable storage medium that stores code executable by a processor to identify an unreserved amount of memory in a computer system, requesting a portion of the memory based on the unreserved amount of memory, determining whether an allocated portion of the memory comprises non-contiguous memory addresses, and performing a memory diagnostic test on the allocated portion of the memory in response to the allocated portion consisting solely of contiguous memory addresses.

In some embodiments, the program products also include code to release the allocated portion of the memory in response to the allocated portion comprising non-contiguous memory addresses, and code to request a second portion of the memory based on the unreserved amount of memory. In further embodiments, the program products include code to determine a testable block of memory, code to calculate a number of testable blocks that will fit in the second portion of memory, and code to request the number of testable blocks.

FIG. 1 depicts a system 100 for allocating computer memory for memory diagnostics, according to embodiments of the disclosure. In the embodiments of FIG. 1, the system 100 includes an electronic device 101. Examples of electronic devices include desktop, laptop, tablet, and handheld computers, mobile phones, smartphones, servers, and the like. As depicted the electronic device 101 includes processor 102, a memory diagnostic allocation module 104, a data storage device 106, and a main memory 108. In some embodiments, the main memory 108 includes an operating system 110 and an unreserved memory 116. The main memory 108 may also include code and/or data for one or more applications 114 running on the electronic device 101. Components of the electronic device 101 may be interconnected by a communication medium, such as a computer bus.

The processor 102, in one embodiment, may comprise any known controller capable of executing computer-readable instructions and/or capable of performing logical operations on the input text. For example, the processor 102 may be a microcontroller, a microprocessor, a central processing unit (CPU), a graphics processing unit (GPU), an auxiliary processing unit, a FPGA, or similar programmable controller. The processor 102 reads (i.e., loads into registers) instructions (i.e., program code) stored in the main memory 108 executes instructions stored in memory 108 to perform the methods and routines described herein. In some embodiments, the processor 102 includes a processor cache that loads instructions and/or data from the main memory 108 for execution by the processor 102.

The memory diagnostic allocation module 104, in one embodiment, identifies an unreserved amount of main memory 108, requests a portion of the main memory 108 based on the unreserved amount, and determines if a memory allocation (e.g., an allocated portion of the main memory 108) includes non-contiguous memory addresses. In some embodiments, the memory diagnostic allocation module 104 also determines whether the allocated portion of the main memory 108 includes virtual memory, such as paged memory stored on the data storage device 106. After verifying that no non-contiguous memory addresses and/or no virtual memory is included the allocation, memory diagnostic allocation module 104 may perform a memory diagnostic test on the allocated portion of the main memory 108.

In some embodiments, the memory diagnostic allocation module 104 determines a testable amount of memory that is less than the unreserved amount of main memory 108, and requests a portion of the main memory 108 equal to the testable amount. In some embodiments, the testable amount is determined as a predetermined percentage of the unreserved amount or as the unreserved amount less a predetermined amount. In some embodiments, the testable amount is dynamically determined taking into account factors such as usage history, time of day, existing fragmentation, user preference, and the like.

In some embodiments, the memory diagnostic allocation module 104 determines whether the allocated portion of memory comprises non-contiguous memory addresses by attempting to load the allocated portion into a single buffer. In some embodiments, the memory diagnostic allocation module 104 determines whether the allocated portion of memory comprises non-contiguous memory addresses via a memory management function in the operating system 110. In some embodiments, the memory diagnostic allocation module 104 determines whether the allocated portion of memory comprises non-contiguous memory addresses using an Application Programming Interface (API) for a memory module. In some embodiments, the memory diagnostic allocation module 104 locks the allocated portion of the main memory 108 to prevent the allocation from being paged to the data storage device 106.

Responsive to the memory allocation including non-contiguous memory addresses and/or virtual memory, the memory diagnostic allocation module 104 releases the memory allocation and requests a second portion of the main memory 108. In some embodiments, the memory diagnostic allocation module 104 requests a second portion of the main memory 108 smaller in size than the originally requested portion. In some embodiments, the memory diagnostic allocation module 104 requests, as the second portion of the main memory 108, a plurality of testable blocks of memory. The size of the testable block is generally much smaller than the size of the originally requested portion (e.g., the testable amount). In some embodiments, the size of the testable block is predetermined, such as a 1 MB block.

In some embodiments, the size of the testable blocks and the number of testable blocks are selected so that the second portion is the same size as the originally requested portion. In some embodiments, where the size of the originally requested portion divided by the size of the testable blocks is a non-integer amount, the memory diagnostic allocation module 104 also requests, as the second portion of the main memory 108, an additional amount of memory equal to the difference between the originally requested portion of memory and a sum of the plurality of testable blocks.

The memory diagnostic allocation module 104 may be triggered automatically in response to system failure (crash, unrecoverable program error, etc.) or manually triggered by a user of the electronic device 101. In some embodiments, the memory diagnostic allocation module 104 operates simultaneously with the operating system 110 and/or the applications 114. That is to say that memory diagnostic using the memory diagnostic allocation module 104 may not require that the operating system 110 and/or the applications 114 be closed and their processes terminated. In further embodiments, the memory diagnostic allocation module 104 may allow the applications 114 to request additional memory resources (i.e., via dynamic allocation) and/or allow additional applications 114 to be launched (i.e., loaded into the main memory 108 and executed on the processor 102) while diagnosing the main memory 108. Beneficially, the memory diagnostic allocation module 104 prevents undue paging to virtual memory (i.e., to the data storage device 106) while diagnosing the main memory 108.

The auxiliary storage device 106, in one embodiment, is a non-volatile (i.e., persistent) computer readable storage medium. The data storage device 106 is a re-writable storage medium and typically stores data and/or program code. The data and/or program code may be operated on by the processor 102, and is loaded into the main memory 108 prior to operation by the processor 102. The data storage device 106 may be a hard disk drive, a flash memory, and/or another suitable non-volatile re-writable computer storage device.

In some embodiments, the data storage device 106, provides greater storage than the main memory 108, but is slower to access data (i.e., read, write, and/or erase data) and has less bandwidth than the main memory 108. Generally, the data storage device 106 is cheaper than the main memory 108 and provides an affordable data storage solution for the electronic device 101.

In some embodiments, the data storage device 106 supplements the main memory 108 by providing virtual memory where portions of the main memory 108 are transferred to the data storage device 106 in a process known as "paging." Virtual memory allows utilization of more primary storage capacity than is physically available in the main memory 108. As the main memory 108 fills up, the least-used sections (i.e., pages) of the main memory 108 are moved (i.e., swapped) into to the data storage device 106 and later retrieved as needed. However, retrievals from the data storage device 106 are slower than from the main memory 108, so the performance of the electronic device 101 degrades as more retrievals from the data storage device 106 are needed.

While the data storage device 106 is susceptible to memory storage errors (i.e., memory faults), unusable areas of the data storage device 106 (e.g., sectors, blocks, or other subdivisions) are typically marked and avoided by the electronic device 101 with little consequence due to the size of the data storage device 106. Therefore, because of the slow access to the data storage device 106 and the lesser consequence of memory faults in the data storage device 106, the memory diagnostic allocation module 104 tries to diagnose the main memory 108 and not the data storage device 106.

The main memory 108, in one embodiment, is a primary memory of the electronic device 101. The main memory 108 is directly accessible by the processor 102 and may include one or more memory modules. Each memory module in the main memory 108 includes an array of memory cells, each storing a data value. In some embodiments, the main memory 108 comprises a volatile computer readable storage medium. For example, the main memory 108 may be a random access memory (RAM), including dynamic RAM (DRAM), synchronous dynamic RAM (SDRAM), and/or static RAM (SRAM). In some embodiments, the memory 108 contains an operating system 110 and an unreserved memory 116. The main memory 108 may also include program code and/or data for one or more applications 114 actively running on the electronic device 101. The main memory 108 runs active programs, such as the applications 114. To run (i.e., execute on the processor 102) an application 114, program code for the application 114 must be loaded from the data storage device 106 into the main memory 108. Sometimes program data for the application 114 must also be loaded into main memory 108 in order to run an application 114.

The main memory 108 gives faster access to data and allows for higher bandwidth than the data storage device 106. However, the main memory 108, provides less storage than the data storage device 106, and, in general, is more expensive than the data storage device 106. Accordingly, the main memory 108 may be supplemented by the data storage device 106 by paging (i.e., swapping) the least-used sections (i.e., pages) of the main memory 108 into the data storage device 106 and later loading the sections back into the main memory 108 as needed. Virtual memory allows utilization of more primary storage capacity than is physically available in the main memory 108. However, when paging is used, a problem called "thrashing" can occur, in which the processor 102 spends an unsuitably large amount of time transferring pages to and from the data storage device 106, thereby slowing down useful work done by the processor 102. When determining the testable portions, the memory diagnostic allocation module 104 may ensure that sufficient amounts of the unreserved memory 116 are left for use by other programs, such as the applications 114, to prevent trashing while performing memory diagnostics tests.

Some areas of memory (pages) may be locked (i.e., pinned or fixed) to prevent them from being swapped to the data storage device 106. Some pages may be locked for short periods of time, others may be pinned for long periods of time, and still others may need to be permanently pinned. When all sections in the main memory 108 are already in use, the electronic device 101 must free a page in the main memory 108 to hold the swapped-in page. The electronic device 101, typically via the operating system 110, may use one of a variety of page replacement algorithms, such as least recently used, to determine which page to swap into the data storage device 106, thereby freeing space in the main memory 108.

Electrical problems in the main memory 108 can prevent correct data storage and/or access, thereby causing several different memory faults (i.e., memory storage errors). Memory faults can prevent instructions from being properly executed and/or corrupt data values leading to system instability and crashes, thereby preventing the electronic device 101 from functioning as designed. The memory diagnostic allocation module 104 is configured to detect and diagnose memory faults in the main memory 108.

The operating system 110, in one embodiment, is a collection of program code that manages hardware resources of the electronic device 101 and provides services to programs running on the electronic device 101, such as the applications 114. Services provides by the operating system 110 include process management, memory management, file system, device drives, and input/output (I/O). In some embodiments, the operating system 110 acts as an intermediary between hardware in the electronic device 101 and the applications 114. In some embodiments, the operating system 110 includes a memory manager 112 that provides memory management services.

The memory manager 112, in one embodiments, is a memory management function that allocates memory among competing processes and programs, such as the applications 114. In some embodiments, the memory manager 112 tracks the status of each memory location. For example, the memory manager 112 may track which memory locations are allocated and which are available. In some embodiments, the memory manager 112 receives a request for memory and determines which processes and/or programs are allocated memory, how much memory they are allocated, and when they receive the allocation. In further embodiments, when memory is allocated, the memory manager 112 determines which memory locations will be assigned to a particular process and/or program and updates the status of those memory locations. In some embodiments, the memory manager 112 also tracks when memory is released (i.e., freed) by a process and/or program, and updates the status if the released memory locations.

In some embodiments, the memory manager 112 support dynamic memory allocation where portions of memory are dynamically allocated to programs at their request. The programs then free the memory allocations for reuse when no longer needed. Fulfilling an allocation request includes locating a block of unused memory of sufficient size. Memory requests are satisfied by allocating portions of the unreserved memory 116. However, fragmentation may occur when there are small gaps between allocated memory blocks, which invalidates their use for an allocation request. The memory manager 112 allocates memory so as to minimize fragmentation. When diagnosing memory, conventional memory test solutions are unable to efficiently account for fragmented memory.

In some embodiments, the memory manager 112 is configured to allocate locations in the main memory 108 and the data storage device 106 to fulfill a request for memory. When a process and/or program requests a large amount of memory, the memory manager 112 may include storage locations in the data storage device 106 to fulfill the request. In some embodiments, the memory manager 112 is configured to support requests for only memory locations in the main memory 108.

The one or more applications 114, in one embodiment, are executed on the processor 102 to provide functions and services to a user of the electronic device 101. The applications 114 comprise computer readable instructions in the form of program code and may be stored on the data storage device 106 and/or the main memory 108. In some embodiments, the applications 114 also include program data. The applications 114 request allocations of the main memory 108 from the operating system 110 and/or the memory manager 112 and release the allocated memory for reuse when no longer needed.

In some embodiments, the applications 114 are able to run while the memory diagnostic allocation module 104 diagnoses the main memory 108 for memory faults. In some embodiments, the memory diagnostic allocation module 104 is configured to interrupt the applications 114 and page program code and/or data associated with the applications 114 to the data storage device 106 in order to free additional amounts of the main memory 108 for performing memory diagnostics tests.

The unreserved memory 116, in one embodiment, includes all memory addresses of the main memory 108 that are not allocated to programs, such as the operating system 110 and the applications 114. This pool of unreserved memory is available for allocation to a requesting process and/or program and allocations are managed through the operating system 110 and/or the memory manager 112. When segments of the memory main memory 108 are no longer needed by a process and/or program, they are released and become a part of the unreserved memory 116.

The memory diagnostic allocation module 104 is configured to run memory diagnosis tests on the unreserved memory 116 so as to avoid interfering with the operating system 110 and/or applications 114 and destabilizing the electronic device 101. In some embodiments, the memory diagnostic allocation module 104 only performs memory diagnostics tests when there is a minimum amount of unreserved memory 116. In some embodiments, the memory diagnostic allocation module 104 is configured to interrupt the applications 114 and page program code and/or data associated with the applications 114 to the data storage device 106 in order to achieve the minimum amount of unreserved memory 116.

Figure 2:
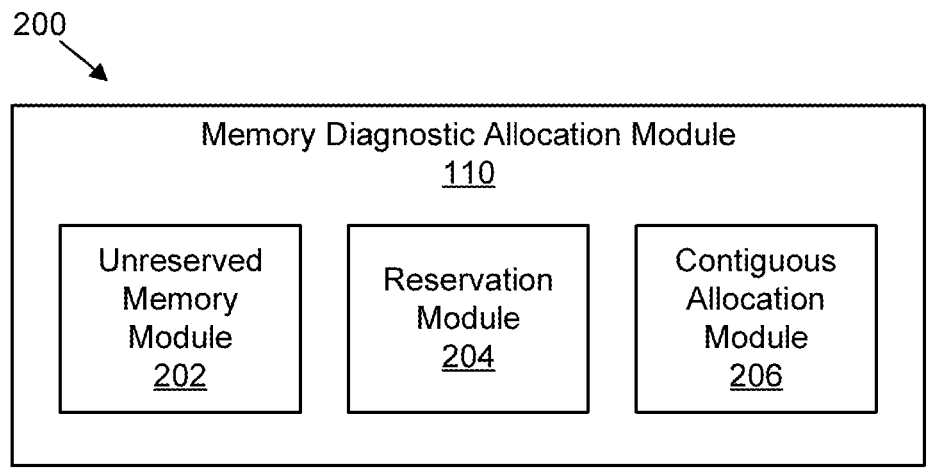
FIG. 2 is a schematic block diagram illustrating one embodiment of an apparatus for allocating computer memory for memory diagnostics.

FIG. 2 depicts an apparatus 200 for allocating computer memory for memory diagnostics, according to embodiments of the disclosure. Apparatus 200 includes a memory diagnostic allocation module 104 as described above with reference to FIG. 1. In general, as described above, the memory diagnostic allocation module 104 may identify an unreserved amount of a computer memory, request a portion of the computer memory based on the unreserved amount, and determine if an allocated portion of the memory includes non-contiguous memory addresses. In the embodiments of FIG. 2, the memory diagnostic allocation module 104 includes an unreserved memory module 202, a reservation module 204, and a contiguous allocation module 206. Components of the memory diagnostic allocation module 104 may be communicatively coupled to each other and may pass information to each another.

The unreserved memory module 202, in one embodiment, is configured to identify an amount of unreserved memory 116 in the main memory 108 as described above with reference to FIG. 1. In some embodiments, the unreserved memory module 202 queries the main memory 108 to identify reserved (i.e., allocated) addresses and unreserved (i.e., available) addresses. In some embodiments, the unreserved memory module 202 queries the operating system 110 and/or memory manager 112 to identify reserved addresses or address blocks in the main memory 108. For example, the operating system 110 and/or memory manager 112 may track whether each location in the main memory 108 is allocated or available. In further embodiments, the unreserved memory module 202 uses an interface, such as a memory module API, to query the main memory 108 and/or the memory manager 112 to identify the unreserved memory 116.

In some embodiments, the unreserved memory module 202 determines a number of unallocated memory addresses. For example, in some embodiments, an amount of allocated memory addresses may be determined and subtracted from a total amount of memory, thereby arriving at the unreserved amount. In other embodiments, unreserved addresses may be counted or tracked to arrive at the unreserved amount.

The reservation module 204, in one embodiment, is configured to request a portion of the main memory 108 based on the amount of unreserved memory 116. The size of the requested portion is less than the amount of unreserved memory 116. By requesting the lesser amount, the memory diagnostic allocation module 104 leaves memory for use by other programs, such as the applications 114, and increases the likelihood that the allocated memory will be contiguous and consist solely of physical memory. The reservation module 204 may request system memory via the operating system 110 and/or the memory manager 112. Where supported by the operating system 110, the reservation module 204 may specifically request that the allocation be a single contiguous allocation and that it be solely from the main memory 108.

The reservation module 204 requests an amount of memory large enough to diagnose a significant portion of the main memory 108, but small enough to avoid degrading system performance by monopolizing system memory. In some embodiments, the reservation module 204 dynamically determines a testable amount of memory, leaving a reasonable amount of the unreserved memory 116 available for other processes and/or programs. The reservation module 204 may dynamically determine the testable amount based on one or more of usage history, time of day, existing fragmentation, and/or user preference. In some embodiments, the testable amount is selected to be smaller than (or equal to) the largest fragment of free memory. In some embodiments, the usage history may include memory activity patterns, such as how many page requests to virtual memory occurred when a last memory diagnostics test was performed. In further embodiments, the testable amount may leave a larger portion for other programs if page requests during the last memory diagnostics test exceed a threshold.

In some embodiments, the reservation module 204 requests a predetermined percentage of the unreserved memory 116. For example, a predetermined percentage may be set by manufacturer and/or user, the predetermined percentage being a balance between testing a useful portion of the main memory 108 while leaving a practical amount of unreserved memory 116 available for the applications 114. In some embodiments, a special memory module with known errors may be used to calculate the predetermined percentage. The predetermined percentage could be raised or lowered until all known error are detected a statistically acceptable number of times using the techniques described herein.

In certain embodiments, the reservation module 204 requests an amount equal to 80% of the unreserved memory 116. In some embodiments, the reservation module 204 requests the unreserved memory 116 less a predetermined reverse amount for use by other programs. For example, the predetermined reserve amount may be an amount calculated to keep paging (i.e., swapping) to the data storage device 106 below a threshold rate.

The contiguous allocation module 206, in one embodiment, is configured to determine whether an allocated portion of memory is made solely of contiguous physical addresses or if it includes non-contiguous physical addresses. In certain embodiments, the contiguous allocation module 206 attempts to load the allocated portion of memory into a single buffer. Success indicates that the allocated portion consists solely of contiguous physical memory addresses, while failure indicates that the allocated portion includes non-contiguous addresses.

In some embodiments, the contiguous allocation module 206 queries the operating system 110 and/or the memory manager 112 to determine whether the allocated portion of memory includes non-contiguous addresses. In some embodiments, the contiguous allocation module 206 uses a memory module API to determine whether the allocated portion of memory includes non-contiguous addresses. In some embodiments, the contiguous allocation module 206 compares a memory address status database before and after receiving the memory allocation to determine whether non-contiguous memory addresses are included in the allocated portion of memory.

Responsive to the allocated portion of memory including non-contiguous memory addresses, the contiguous allocation module 206 is configured to release the memory allocation and the reservation module 204 requests a second portion of the main memory 108. In some embodiments, the reservation module 204 requests a second portion of the main memory 108 smaller in size than the originally requested portion. In some embodiments, the reservation module 204 requests, as the second portion of the main memory 108, a plurality of testable blocks of memory.

Responsive to the memory allocation not including non-contiguous memory addresses, the contiguous allocation module 206 may be further configured to lock the allocated portion of memory. Locking the allocated memory prevents it from being paged to the data storage device 106. In some embodiments, the contiguous allocation module 206 locks the allocated memory via the operating system 110 and/or the memory manager 112.

In some embodiments, the contiguous allocation module 206 is further configured to determine whether the allocated portion comprises a portion of the data storage device 106 (i.e., virtual memory). While the allocated portion is small enough to reside solely in the main memory 108, in some embodiments, the allocation originally resides in the data storage device 106. In some embodiments, the contiguous allocation module 206 writes data values to the allocated portion of memory to cause any pages of the allocation residing in the data storage device 106 to be loaded into the main memory 108. In further embodiments, the contiguous allocation module 206 may request that portions of the applications 114 be paged into the data storage device 106 to increase the likelihood that the memory allocation includes only locations in the main memory 108.

Responsive to the memory allocation including virtual memory, the contiguous allocation module 206 is configured to release the memory allocation and the reservation module 204 requests a second portion of the main memory 108. In some embodiments, the second portion includes a plurality of testable blocks, the size and the number of testable blocks selected so that the second portion is the same size as the original memory allocation.

Figure 3:
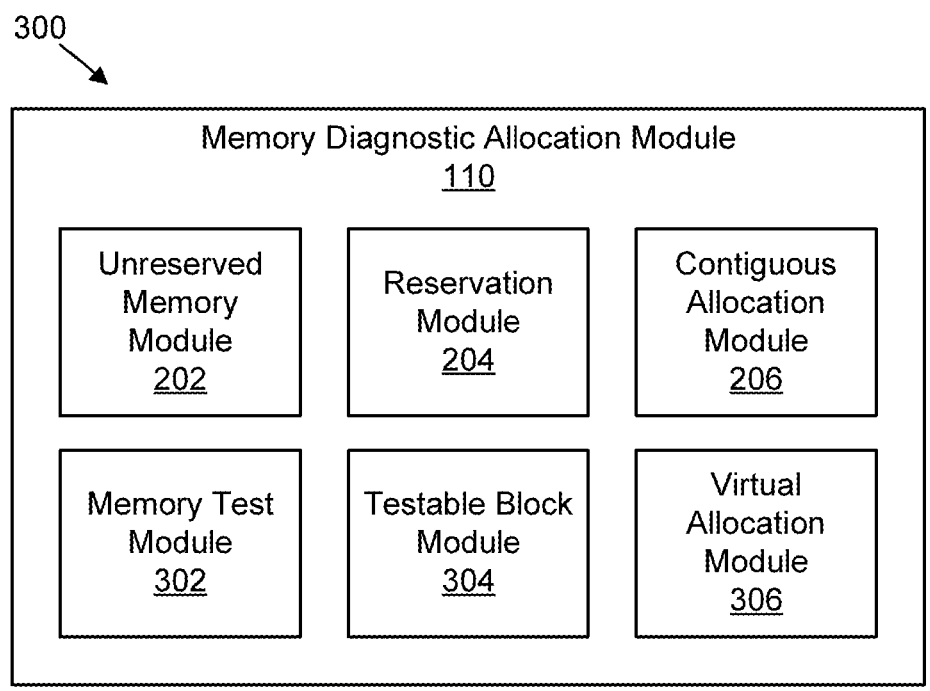
FIG. 3 is a schematic block diagram illustrating another embodiment of an apparatus for allocating computer memory for memory diagnostics.

FIG. 3 depicts an apparatus 300 for allocating computer memory for memory diagnostics, according to embodiments of the disclosure. Apparatus 300 includes a memory diagnostic allocation module 104, such as the memory diagnostic allocation module 104 described above with reference to FIGS. 1 and 2. In general, as described above, the memory diagnostic allocation module 104 may identify an unreserved amount of a computer memory, request a portion of the computer memory based on the unreserved amount, and determine if an allocated portion of the memory includes non-contiguous memory addresses. The memory diagnostic allocation module 104 may include an unreserved memory module 202, a reservation module 204, and a contiguous allocation module 206, as described above with reference to FIG. 2. Additionally, in the embodiments of FIG. 3, the memory diagnostic allocation module 104 includes a memory test module 302, a testable block module 304, and a virtual allocation module 306. Components of the memory diagnostic allocation module 104 may be communicatively coupled to each other and may pass information to each another.

The memory diagnostic module 302, in one embodiment, is configured to perform a memory diagnostic test on the allocated portion of main memory 108. The memory test module 302 tests the main memory 108 in response to the memory addresses of the allocated portion being contiguous addresses. The memory test module 302 may test for various memory faults including, but not limited to, stuck-at faults, transition faults, coupling faults, data retention faults, read random faults, and addressing faults. In some embodiments, the memory test module 302 may be further configured to lock the allocated portion of memory prior to performing the memory diagnostic test. Locking the allocated memory prevents it from being paged to the data storage device 106. In some embodiments, the memory test module 302 locks the allocated memory via the operating system 110 and/or the memory manager 112.

The memory test module 302 may use any known testing pattern or any known algorithm to test 508 for memory faults. In some embodiments, the memory test module 302 tests each address in the allocated portion of the main memory 108 on a bit-by-bit basis. In other embodiments, the memory test module 302 tests each address on a word-by-word basis. The word used to test the allocated portion of the main memory 108 may be several bytes in length and, in some embodiments, may be selected based on the type of processor 102. For example, 32-bit processors may test the main memory 108 using 4-byte words, while 64-bit processors may test the main memory 108 using 8-byte words. In certain embodiments, the memory allocation device uses a March algorithm, or a variant thereof, to test 508 the allocated portion for memory faults.

The testable block module 304, in one embodiment, is configured to determine a testable block of memory. In some embodiments, the testable block module 304 is a component of the reservation module 204 and/or the contiguous allocation module 206. In other embodiments, the testable block module 304 operates separately from the reservation module 204 and/or the contiguous allocation module 206. The testable block module 304 determines the testable block in response to the original memory allocation having non-contiguous addresses and/or virtual memory (i.e., pages residing in the data storage device 106). After the contiguous allocation module 206 releases the original memory allocation, the testable block module 304 determines a testable block size.

In some embodiments, the testable blocks are significantly smaller than the original memory allocation (e.g., the testable amount). The testable block size is selected to be a balance between speed and ease of memory diagnostics testing and high probability of solely contiguous addresses. The size of the memory blocks, in some embodiments, is selected to ensure that each memory block is not fragmented and does not include virtual memory. In certain embodiments, the testable block size is a percentage of the testable amount. In other embodiments, the testable block size is a predetermined size, such as a 1 MB block. In yet other embodiments, the testable block is selected to be smaller than (or equal to) the largest fragment of free memory.

In some embodiments, the testable block module 304 calculates a number of testable blocks that will fit in the testable amount of memory and/or the original memory allocation. In some embodiments, where the size of the originally requested portion divided by the size of the testable blocks is a non-integer amount, the testable block module 304 also determines an additional amount of memory equal to the difference between the originally requested portion of memory and a sum of the plurality of testable blocks. The testable block module 304 may coordinate with the reservation module 204 to request the calculated number of testable blocks and/or the additional amount.

The virtual allocation module 306, in one embodiment, is configured to determine whether the allocated portion of memory comprises virtual memory. While the requested amount may be small enough to reside solely in the main memory 108, in some embodiments, the allocation originally resides in the data storage device 106. In some embodiments, the virtual allocation module 306 is component of the contiguous allocation module 206. In other embodiments, the virtual allocation module 306 operates separately from the contiguous allocation module 206.

In some embodiments, the virtual allocation module 306 queries the operating system 110 and/or the memory manager 112 to determine whether the allocated portion of memory includes virtual memory. In some embodiments, the virtual allocation module 306 compares a memory address status database before and after receiving the memory allocation to determine whether virtual memory is included in the allocated portion of memory.

In some embodiments, the virtual allocation module 306 writes data values to the allocated portion of memory to cause any pages of the allocation residing in the data storage device 106 to be loaded into the main memory 108. In further embodiments, the virtual allocation module 306 may request that portions of the applications 114 be paged into the data storage device 106 to increase the likelihood that the memory allocation includes only locations in the main memory 108.

Responsive to the allocated portion of memory including virtual memory, the virtual allocation module 306 is configured to release the memory allocation, and the reservation module 204 requests a second portion of the main memory 108. In some embodiments, the reservation module 204 requests a second portion of the main memory 108 that is smaller in size than the originally requested portion. In some embodiments, the reservation module 204 requests, as the second portion of the main memory 108, a plurality of testable blocks of memory. The size and number of testable blocks may be determined by the testable block module 304.

Responsive to the memory allocation not including virtual memory, the virtual allocation module 306 may be further configured to lock the allocated portion of memory. Locking the allocated memory prevents it from being paged to the data storage device 106. In some embodiments, the virtual allocation module 306 locks the allocated memory via the operating system 110 and/or the memory manager 112.

Figure 4A:
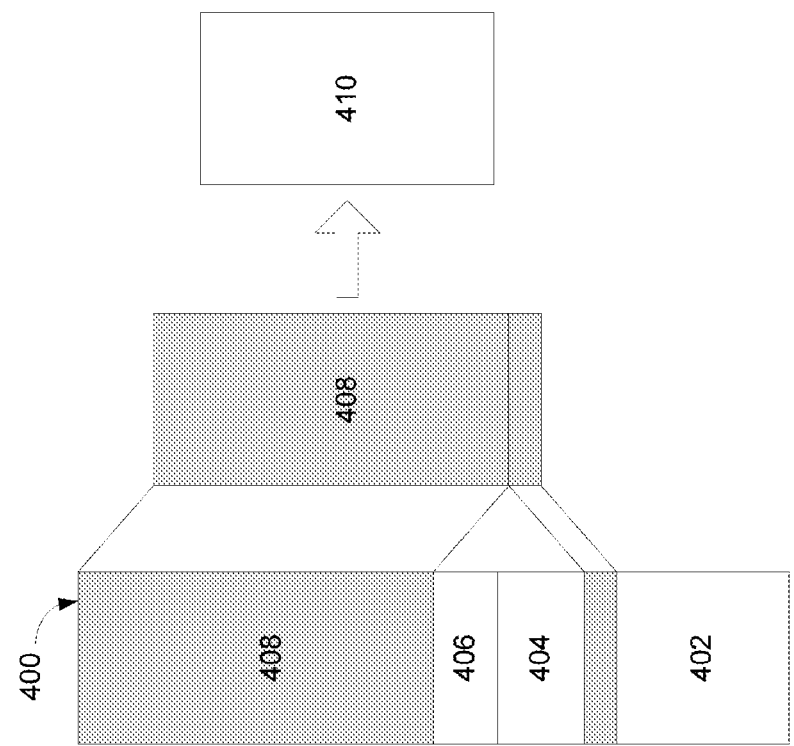
FIG. 4A is a diagram illustrating one embodiment of a computer memory prior to allocating computer memory for memory diagnostics.
Figure 4B:
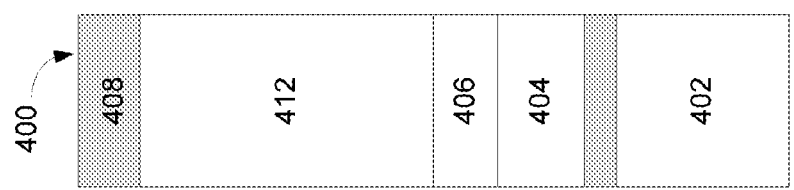
FIG. 4B is a diagram illustrating one embodiment of a computer memory after allocating computer memory for memory diagnostics.
Figure 4C:
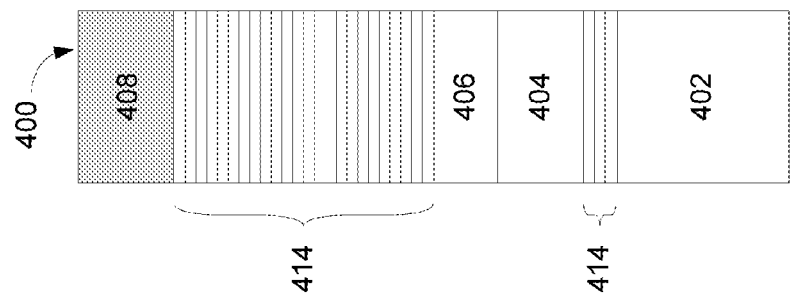
FIG. 4C is a diagram illustrating another embodiment of a computer memory after allocating computer memory for memory diagnostics.

FIGS. 4A-4C are diagrams depicting an example of allocating a computer memory 400 for memory diagnostics, according to embodiments of the disclosure. The computer memory 400 may be similar to the main memory 108 described above with reference to FIGS. 1-3.

FIG. 4A shows the computer memory 400 prior to allocating a portion of memory for memory diagnostics. The computer memory 400 includes a portion 402 allocated to an operating system, such as the operating system 110 described above with reference to FIGS. 1-3, a portion 404 allocated to a program, such as an application 114 described above, and a portion 406 allocated to an memory diagnostic allocation process, such as the memory diagnostic allocation module 104 described above.

The computer memory 400 also includes an unreserved portion 408. Similar to the unreserved memory 116, the unreserved portion 408 includes all memory addresses of the computer memory 400 that are not allocated to programs, such as the operating system portion 402, the active application portion 404, and the memory diagnostic process portion 406. This pool of unreserved memory is available for allocation to a requesting process and/or program and allocations are managed through the operating system 110 and/or the memory manager 112.

As depicted, the unreserved portion 408 includes a block of memory addresses located between the operating system portion 402 and the active application portion 404. As depicted, the computer memory 400 is fragmented, as the unreserved portion 408 includes non-contiguous memory addresses. Using the unreserved portion 408, a testable amount 410 of memory is determined. In FIG. 4A, the testable amount 410 is calculated as 80% of the size of the unreserved portion 408.

FIG. 4B shows one example of the memory 400 after allocating memory for memory diagnostics. The computer memory 400 includes the operating system portion 402, active application portion 404, and memory diagnostic process portion 406 described above with reference to FIG. 4A. Additionally, the computer memory 400 includes an allocated portion 412 equal in size to the testable amount 410 has been allocated to the memory diagnostic allocation function for memory diagnostics. The allocation of the allocated portion 412 has reduced the unreserved portion 408 by an amount corresponding to the size of the allocated portion 412. After the allocation of the allocated portion 412, the memory diagnostic allocation function verifies that the allocated portion 412 consists of contiguous and/or physical (real) addresses. If the allocated portion 412 includes non-contiguous or virtual allocations, the memory diagnostic allocation function releases the allocated portion 412 and requests a new portion.

After verifying that the allocated portion 412 consists of contiguous and/or physical (real) addresses, the memory diagnostic allocation function locks the allocated portion 412 to prevent paging to virtual memory (i.e., the data storage device 106) and performs one or more memory diagnostics tests on the allocated portion 412.

FIG. 4C shows another example of the memory 400 after allocating memory for memory diagnostics. The computer memory 400 includes the operating system portion 402, active application portion 404, and memory diagnostic process portion 406 described above with reference to FIG. 4A. Additionally, the computer memory 400 includes a second allocated portion 414 has been allocated to the memory diagnostic allocation function for memory diagnostics. The allocation of the second allocated portion 414 has reduced the unreserved portion 408 by an amount corresponding to the size of the allocated portion 412. The second allocated portion 414 comprises a plurality of smaller memory blocks. As depicted in FIG. 4C, the memory blocks are significantly smaller than the testable amount 410, however the size of the second allocated portion 414 is the same as the testable amount 410. The size of the memory blocks, in some embodiments, is selected to ensure that each memory block is not fragmented and does not include virtual memory.

In some embodiments, the memory diagnostic allocation function verifies that each memory block of the second allocated portion 414 consists of contiguous and/or physical (real) addresses. In other embodiments, the memory diagnostic allocation function has selected memory block sized that avoid fragmented and or virtual allocations of memory. The memory diagnostic allocation function locks the allocated portion 412 to prevent paging to virtual memory (i.e., the data storage device 106) and performs one or more memory diagnostics tests on the allocated portion 412.

Figure 5:
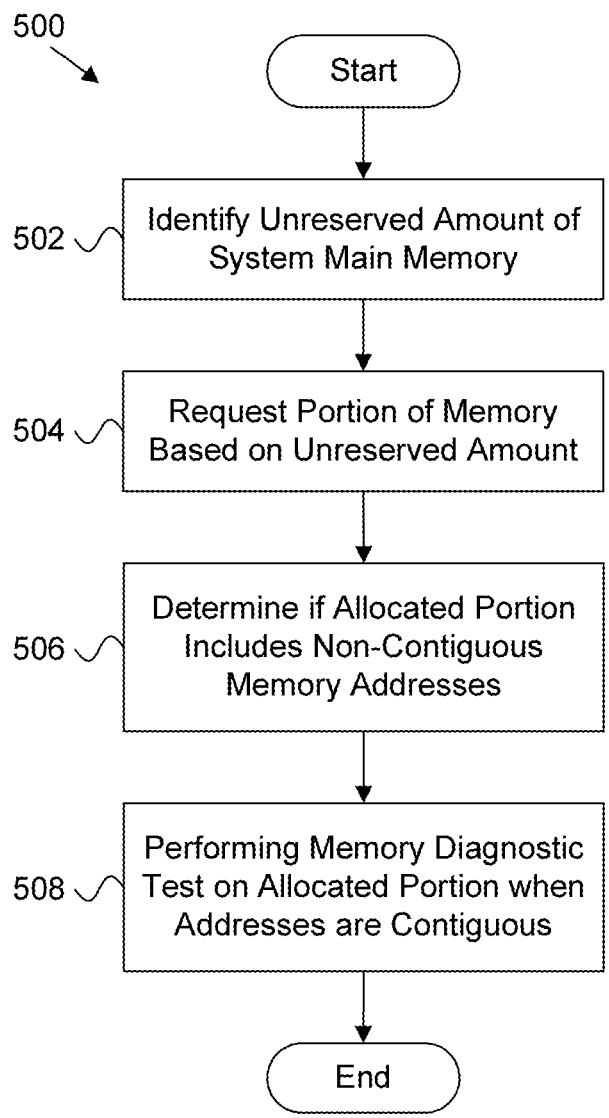
FIG. 5 is a schematic flow chart diagram illustrating one embodiment of a method for allocating computer memory for memory diagnostics.

FIG. 5 depicts a method 500 for allocating computer memory for memory diagnostics, according to embodiments of the disclosure. In some embodiments, the method 500 is performed by a memory allocation device, such as the memory diagnostic allocation module 104 described above with reference to FIGS. 1-3. In further embodiments, the method 500 is performed by a processor executing program code, such as the processor 102 described above with reference to FIG. 1.

The method 500 begins with the memory allocation device identifying 502 an unreserved amount of system main memory. In some embodiments, the system main memory, such as the main memory 108 described above, may be queried to identify reserved (i.e., allocated) addresses and unreserved (i.e., available) addresses. In some embodiments, an operating system, such as the operating system 110 described above, is queried to identify reserved addresses or address blocks. For example, the operating system may include a memory management function, such as the memory manager 112 described above, that tracks whether each location in the system memory is allocated or available. In further embodiments, the operating system may provide an interface, such as a memory module API, for querying the system memory and/or the memory manager to identify 502 unreserved addresses in memory. In some embodiments, the operating system 110 and/or memory manager 112 maintains a database of the statuses for memory locations, for example a list of free blocks of memory. The database may be updated whenever memory is reserved (i.e., allocated) or released.

In some embodiments, identifying 502 the unreserved amount of system memory includes determining a number of unallocated memory addresses. For example, in some embodiments, an amount of allocated memory addresses may be determined and subtracted from a total amount of memory, thereby arriving at the unreserved amount. In other embodiments, unreserved addresses may be counted or tracked to arrive at the unreserved amount.

The memory allocation device then requests 504 a portion of the system memory based on the unreserved amount. The size of the requested portion is less than the unreserved amount of memory. By requesting the lesser amount, the memory allocation device leaves memory for use by other programs, such as the applications 114, and increases the likelihood that the allocated memory will be contiguous and consist solely of physical memory. The memory allocation device may request 504 system memory from an operating system and/or from a memory manager. In some embodiments, the operating system supports single contiguous allocations and the memory allocation device specifically requests 504 a single contiguous allocation.

Typically, the requested 504 amount of memory is large enough to diagnose a significant portion of the system memory, but small enough to avoid degrading system performance by monopolizing system memory. In some embodiments, the memory allocation device dynamically determines a testable amount of memory to request 504, leaving a reasonable amount of free memory available for other processes and/or programs. The memory allocation device may dynamically determine the testable amount based on one or more of usage history, time of day, existing fragmentation, and/or user preference. In other embodiments, the memory allocation device determines a predetermined percentage of the unreserved memory, or the amount of unreserved memory less a predetermined reverse amount, as the testable amount. The predetermined reserve amount may be an amount for use by other programs calculated to keep paging (i.e., swapping) to virtual memory below a threshold rate.

The memory allocation device then determines 506 whether an allocated portion of memory includes non-contiguous memory addresses. Typically, a program doesn't know in advance what range of addresses it will get back for the allocate memory request. As contiguous physical addresses are more beneficial for diagnosing memory, the memory allocation device determines 506 whether the memory allocation is made solely of contiguous physical addresses or if it includes non-contiguous physical addresses.

In certain embodiments, the memory allocation device determines 506 whether non-contiguous memory addresses are included in the allocated portion by attempting to load the allocated portion of memory into a single buffer. Success indicates that the allocated portion consists solely of contiguous physical memory addresses, while failure indicated that the allocated portion includes non-contiguous addresses.

In some embodiments, the memory allocation device queries the operating system and/or a memory manager to determine 506 whether the memory allocation includes non-contiguous addresses. In some embodiments, the memory allocation device uses a memory module API to determine 506 whether the memory allocation includes non-contiguous addresses. In some embodiments, the memory allocation device compares a memory address status database before and after requesting 504 a portion of the system memory in order to determine 506 whether non-contiguous memory addresses are included in the allocated portion.

The memory allocation device then performs 508 a memory diagnostic test on the allocated portion of memory in response to the memory addresses of the allocated portion being contiguous addresses. The memory diagnosis test may test 508 for various memory faults including, but not limited to, stuck-at faults, transition faults, coupling faults, data retention faults, read random faults, and addressing faults. The memory diagnosis test may use any known pattern or any known algorithm to test 508 for memory faults. In certain embodiments, the memory allocation device uses a March algorithm, or a variant thereof, to test 508 the allocated portion for memory faults. The method 500 ends.

Figure 6:
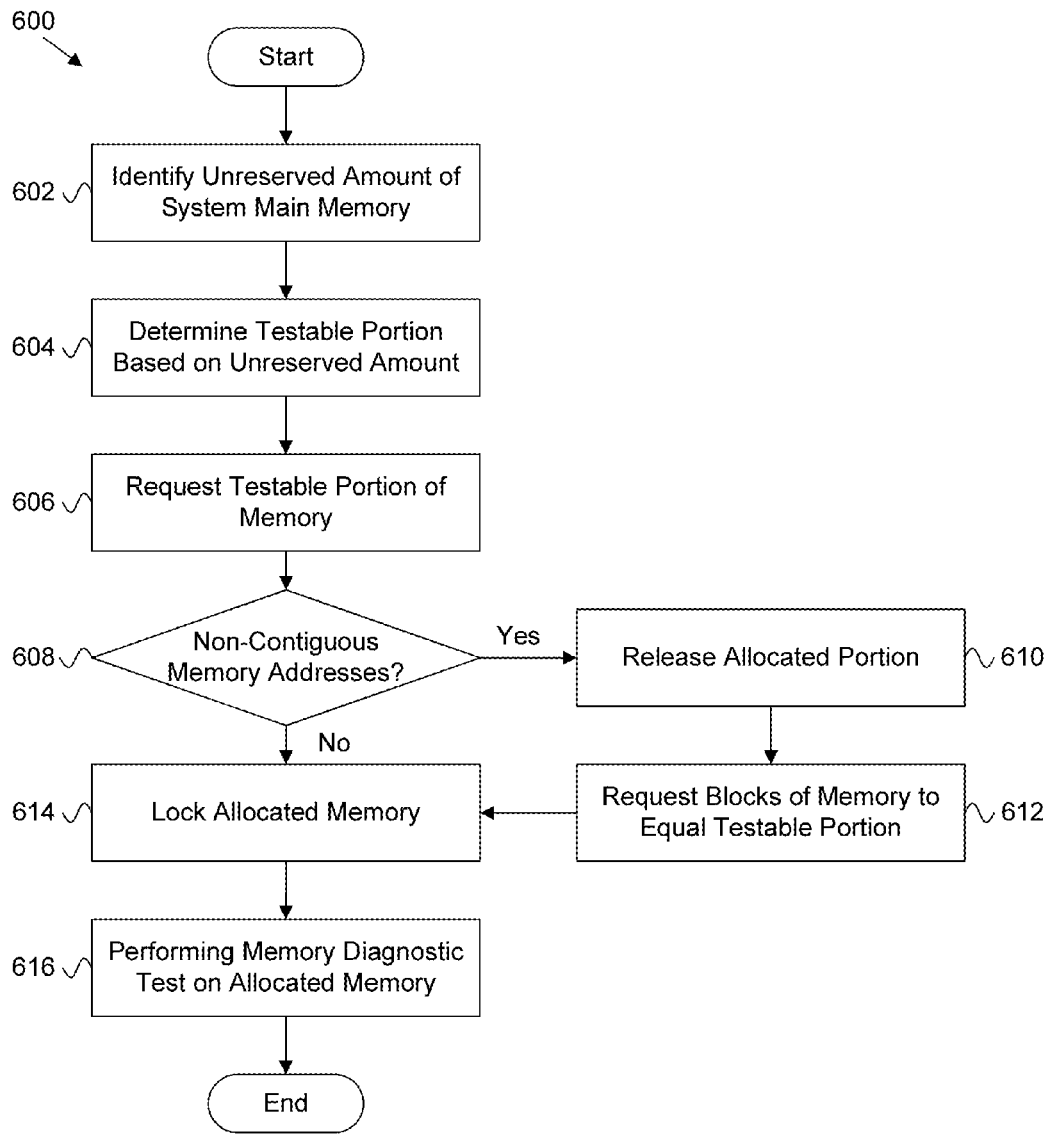
FIG. 6 is a schematic flow chart diagram illustrating another embodiment of a method for allocating computer memory for memory diagnostics.

FIG. 6 depicts a method 600 for allocating computer memory for memory diagnostics, according to embodiments of the disclosure. In some embodiments, the method 600 is performed by a memory allocation device, such as the memory diagnostic allocation module 104 described above with reference to FIGS. 1-3. In further embodiments, the method 600 is performed by a processor executing program code, such as the processor 102 described above with reference to FIG. 1.

The method 600 begins with the memory allocation device identifying 602 an unreserved amount of system main memory. In some embodiments, the system main memory, such as the main memory 108 described above, may be queried to identify reserved (i.e., allocated) addresses and unreserved (i.e., available) addresses. In some embodiments, an operating system, such as the operating system 110 described above, is queried to identify reserved address blocks. For example, the operating system may include a memory management function, such as the memory manager 112 described above, that tracks whether each location in the system memory is allocated or available.

In further embodiments, the operating system may provide an interface, such as a memory module API, for querying the system memory and/or the memory manager to identify 602 unreserved addresses in memory. In some embodiments, the operating system 110 maintains a database of the statuses for memory locations, for example a list of free blocks of memory. The database may be updated whenever memory is reserved (i.e., allocated) or released.

In some embodiments, identifying 602 the unreserved amount of system memory includes determining a number of unallocated memory addresses. For example, in some embodiments, an amount of allocated memory addresses may be determined and subtracted from a total amount of memory, thereby arriving at the unreserved amount. In other embodiments, unreserved addresses may be counted or tracked to arrive at the unreserved amount.

The memory allocation device then determines 604 a testable portion of the system memory based on the unreserved amount. The size of the testable portion is less than the unreserved amount of memory. Typically, the size of the testable portion is large enough to diagnose a significant portion of the system memory, but small enough to avoid degrading system performance by monopolizing system memory.

In some embodiments, the memory allocation device dynamically determines 604 a testable amount of memory, leaving a reasonable amount of free memory available for other processes and/or programs. The memory allocation device may dynamically determine 604 the testable amount based on one or more of usage history, time of day, existing fragmentation, and/or user preference. In other embodiments, the memory allocation device determines 604 a predetermined percentage of the unreserved memory, or the amount of unreserved memory less a predetermined reverse amount, as the testable amount. The predetermined reserve amount may be an amount for use by other programs calculated to keep paging (i.e., swapping) to virtual memory below a threshold rate.

The memory allocation device then requests 606 the testable portion of the system memory. The memory allocation device may request 606 the testable portion from an operating system and/or from a memory manager. In some embodiments, the operating system supports single contiguous allocations and the memory allocation device specifically requests 606 a single contiguous allocation. In some embodiments, the memory allocation device may specifically request that the allocation not include virtual memory.

The memory allocation device then determines 608 whether an allocated portion of memory includes non-contiguous memory addresses. Typically, a program doesn't know in advance what range of addresses it will get back for the allocate memory request. As contiguous physical addresses are more beneficial for diagnosing memory, the memory allocation device determines 608 whether the memory allocation is made solely of contiguous physical addresses or if it includes non-contiguous physical addresses.

In certain embodiments, the memory allocation device determine 608 whether non-contiguous memory addresses are included in the allocated portion by attempting to load the allocated portion of memory into a single buffer. Success indicates that the allocated portion consists solely of contiguous physical memory addresses, while failure indicated that the allocated portion includes non-contiguous addresses.

In some embodiments, the memory allocation device queries the operating system and/or a memory manager to determine 608 whether the memory allocation includes non-contiguous addresses. In some embodiments, the memory allocation device uses a memory module API to determine 608 whether the memory allocation includes non-contiguous addresses. In some embodiments, the memory allocation device compares a memory address status database before and after requesting 606 a portion of the system memory in order to determine 608 whether non-contiguous memory addresses are included in the allocated portion.

If it is determined 608 that non-contiguous memory addresses are present, then the memory allocation device releases 610 the allocated portion of memory and requests 612 a plurality of smaller blocks of memory to equal the size of the testable portion of memory. Otherwise, the memory allocation device locks 614 the allocated memory.

Requesting 612 the plurality of smaller blocks may include calculating a size for the smaller blocks. The size of each smaller block is generally much less than the size of the originally requested portion (e.g., the testable portion). In some embodiments, where the size of the testable portion divided by the size of the smaller blocks is a non-integer amount, the memory allocation device also requests an additional amount of memory equal to the difference between the testable portion of memory and a sum of the plurality of smaller blocks. The memory allocation device then locks 614 the allocated memory.

Locking 614 the allocated memory prevents it from being swapped to secondary storage, such as the data storage device 106. In some embodiments, the memory allocation device locks 614 the allocated memory via the operating system and/or the memory manager.

The memory allocation device then performs 616 a memory diagnostic test on the allocated portion of memory in response to the memory addresses of the allocated portion being contiguous addresses. The memory diagnosis test may test 616 for various memory faults including, but not limited to, stuck-at faults, transition faults, coupling faults, data retention faults, read random faults, and addressing faults. The memory diagnosis test may use any known pattern or any known algorithm to test 616 for memory faults. In certain embodiments, the memory allocation device uses a March algorithm, or a variant thereof, to test 616 the allocated portion for memory faults. The method 600 ends.

Figure 7:
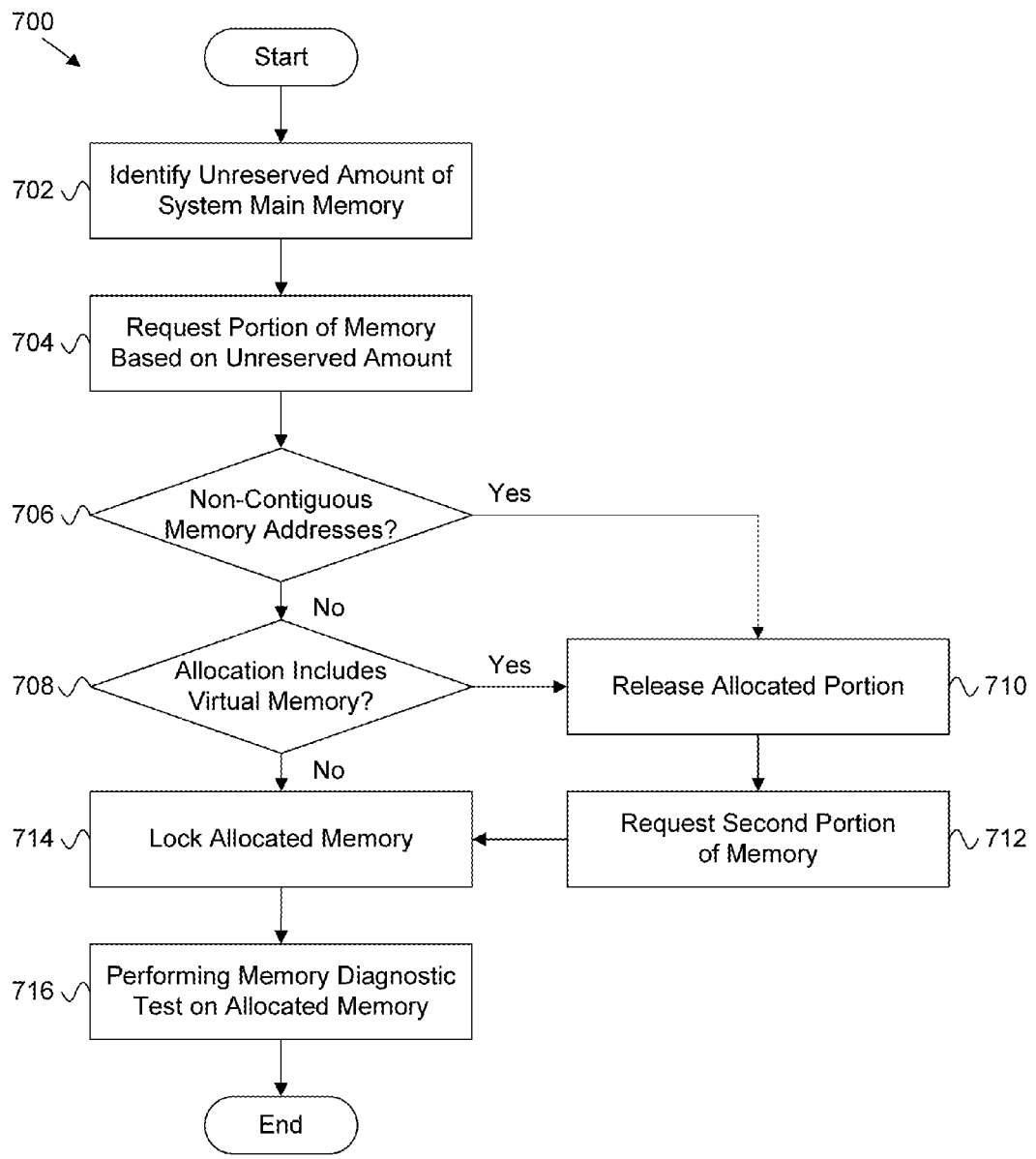
FIG. 7 is a schematic flow chart diagram illustrating another embodiment of a method for allocating computer memory for memory diagnostics.

FIG. 7 depicts a method 700 for allocating computer memory for memory diagnostics, according to embodiments of the disclosure. In some embodiments, the method 700 is performed by a memory allocation device, such as the memory diagnostic allocation module 104 described above with reference to FIGS. 1-3. In further embodiments, the method 700 is performed by a processor executing program code, such as the processor 102 described above with reference to FIG. 1.

The method 700 begins with the memory allocation device identifying 702 an unreserved amount of system main memory. In some embodiments, the system main memory, such as the main memory 108 described above, may be queried to identify 702 reserved (i.e., allocated) addresses and unreserved (i.e., available) addresses. In some embodiments, an operating system, such as the operating system 110 described above, is queried to identify 702 reserved addresses or address blocks. For example, the operating system may include a memory management function, such as the memory manager 112 described above, that tracks whether each location in the system memory is allocated or available. In further embodiments, the operating system may provide an interface, such as a memory module API, for querying the system memory and/or the memory manager to identify 702 unreserved addresses in memory. In some embodiments, the operating system 110 maintains a database of the statuses for memory locations, for example a list of free blocks of memory. The database may be updated whenever memory is reserved (i.e., allocated) or released.

In some embodiments, identifying 702 the unreserved amount of system memory includes determining a number of unallocated memory addresses. For example, in some embodiments, an amount of allocated memory addresses may be determined and subtracted from a total amount of memory, thereby arriving at the unreserved amount. In other embodiments, unreserved addresses may be counted or tracked to arrive at the unreserved amount.

The memory allocation device then requests 704 a portion of the system memory based on the unreserved amount. The size of the requested portion is less than the unreserved amount of memory. By requesting the lesser amount, the memory allocation device leaves memory for use by other programs, such as the applications 114, and increases the likelihood that the allocated memory will be contiguous and consist solely of physical memory. The memory allocation device may request 704 system memory from an operating system and/or from a memory manager. In some embodiments, the operating system supports single contiguous allocations and the memory allocation device specifically requests 704 a single contiguous allocation.

Typically, the requested 704 amount of memory is large enough to diagnose a significant portion of the system memory, but small enough to avoid degrading system performance by monopolizing system memory. In some embodiments, the memory allocation device dynamically determines a testable amount of memory to request 704, leaving a reasonable amount of free memory available for other processes and/or programs. The memory allocation device may dynamically determine the testable amount based on one or more of usage history, time of day, existing fragmentation, and/or user preference. In other embodiments, the memory allocation device determines a predetermined percentage of the unreserved memory, or the amount of unreserved memory less a predetermined reverse amount, as the testable amount. The predetermined reserve amount may be an amount for use by other programs calculated to keep paging (i.e., swapping) to virtual memory below a threshold rate.

The memory allocation device then determines 706 whether an allocated portion of memory includes non-contiguous memory addresses. Typically, a program doesn't know in advance what range of addresses it will get back for the allocate memory request. As contiguous physical addresses are more beneficial for diagnosing memory, the memory allocation device determines 706 whether the memory allocation is made solely of contiguous physical addresses or if it includes non-contiguous physical addresses.

In certain embodiments, the memory allocation device determines 706 whether non-contiguous memory addresses are included in the allocated portion by attempting to load the allocated portion of memory into a single buffer. Success indicates that the allocated portion consists solely of contiguous physical memory addresses, while failure indicated that the allocated portion includes non-contiguous addresses.

In some embodiments, the memory allocation device queries the operating system and/or memory manager to determine 706 whether the memory allocation includes non-contiguous addresses. In some embodiments, the memory allocation device uses a memory module API to determine 706 whether the memory allocation includes non-contiguous addresses. In some embodiments, the memory allocation device compares a memory address status database before and after requesting 704 a portion of the system memory in order to determine 706 whether non-contiguous memory addresses are included in the allocated portion.

If it is determined 706 that only contiguous addresses are present in the allocated portion of memory, then the memory allocation device determines 708 whether the allocated portion includes virtual memory. Otherwise, in response to determining 706 that the allocated portion of memory includes non-contiguous memory addresses, the memory allocation device releases 710 the allocated portion of memory.

In some embodiments, determining 708 whether virtual memory is included within the allocated portion includes querying the operating system and/or a memory manager to determine 708 whether the allocated portion of memory includes virtual memory. In some embodiments, the memory allocation device compares a memory address status database before and after receiving the allocated portion of memory to determine whether virtual memory is included in the allocated portion of memory.

If it is determined 708 that virtual memory is included in the allocated portion of memory, then the memory allocation device releases 710 the allocated portion of memory. Otherwise, in response to determining 708 that the allocated portion of memory does not include virtual memory, the memory allocation device locks 714 the allocated memory.

In response to releasing 710 the allocated portion, the memory allocation device requests 712 a second portion of memory. In some embodiments, the memory allocation device requests a second portion of memory smaller in size than the originally requested portion. In some embodiments, the memory allocation device requests, as the second portion of memory, a plurality of testable blocks of memory. The size of the testable block is generally much smaller than the size of the originally requested portion (e.g., the testable amount).

In some embodiments, the size of the testable blocks and the number of testable blocks are selected so that the second portion is the same size as the originally requested portion. In some embodiments, where the size of the originally requested portion divided by the size of the testable blocks is a non-integer amount, the memory allocation device also requests, as the second portion of the memory, an additional amount of memory equal to the difference between the originally requested portion of memory and a sum of the plurality of testable blocks. The memory allocation device then locks 714 the allocated memory.

Locking 714 the allocated memory prevents it from being swapped to secondary storage, such as the data storage device 106. In some embodiments, the memory allocation device locks 714 the allocated memory via the operating system and/or the memory manager.

The memory allocation device then performs 716 a memory diagnostic test on the allocated portion of memory in response to the memory addresses of the allocated portion being contiguous addresses. The memory diagnosis test may test 716 for various memory faults including, but not limited to, stuck-at faults, transition faults, coupling faults, data retention faults, read random faults, and addressing faults. The memory diagnosis test may use any known pattern or any known algorithm to test 716 for memory faults. In certain embodiments, the memory allocation device uses a March algorithm, or a variant thereof, to test 716 the allocated portion for memory faults. The method 700 ends.

Embodiments may be practiced in other specific forms. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An apparatus comprising:
a processor;
a memory that stores code executable by the processor to
identify an unreserved amount of main memory in a computer system;
request a first allocation from the main memory based on the unreserved amount of main memory;
receive a first memory allocation;
determine whether the first memory allocation comprises non-contiguous memory addresses;
perform a memory diagnostic test on the first memory allocation of the main memory in response to the first memory allocation consisting solely of contiguous memory addresses;
release the first memory allocation in response to the first memory allocation comprising non-contiguous memory addresses;
request a second allocation from the main memory based on the unreserved amount of main memory, wherein requesting the second allocation from the main memory comprises requesting a smaller amount of the main memory than the first memory allocation; and
perform a memory diagnostic test on a second memory allocation received in response to requesting a second allocation of the main memory.

2. The apparatus of claim 1, the code further comprising:
locking an allocated portion of the memory in response to the allocated portion consisting solely of contiguous memory addresses, the allocated portion comprising one of the first memory allocation and the second memory allocation.

3. The apparatus of claim 1, wherein the requesting a second allocation from the main memory comprises the processor:
determining a testable block size for the main memory;
calculating a number of testable blocks that will fit in the first memory allocation; and
requesting the calculated number of testable blocks of the determined testable block size.

4. The apparatus of claim 1, wherein the processor further:
determines a testable amount of main memory less than the unreserved amount of main memory, wherein the processor requesting the first allocation based on the unreserved amount of main memory comprises the processor requesting an amount of the main memory equal to the testable amount of main memory.

5. The apparatus of claim 1, wherein the processor determining whether the first memory allocation comprises non-contiguous memory addresses comprises the processor allocating the first memory allocation into a single buffer.

6. The apparatus of claim 1, wherein the processor identifying an unreserved amount of memory comprises the processor querying an operating system to identify locked areas of the main memory.

7. The apparatus of claim 1, wherein the processor further:
determines whether the first memory allocation comprises virtual memory;
releases the first memory allocation in response to the first memory allocation comprising virtual memory; and
requests the second allocation from the main memory in response to the first memory allocation comprising virtual memory.

8. A method comprising:
identifying, by use of a processor, an unreserved amount of main memory in a computer system;
requesting a first allocation of the main memory based on the unreserved amount of main memory;
receiving a first memory allocation from the main memory in response to requesting a first allocation of the main memory;
determining whether the first memory allocation comprises non-contiguous memory addresses;
performing a memory diagnostic test on the first memory allocation received in response to the first memory allocation consisting solely of contiguous memory addresses;
releasing the first memory allocation in response to the first memory allocation comprising non-contiguous memory addresses;
requesting a second allocation from the main memory based on the unreserved amount of main memory in response to the first memory allocation comprising non-contiguous memory addresses, wherein requesting the second allocation from the main memory comprises requesting a smaller amount of the main memory than the first memory allocation; and performing a memory diagnostic test on a second memory allocation received in response to requesting a second allocation of the main memory.

9. The method of claim 8, further comprising:
locking an allocated portion of the memory in response to the allocated portion consisting solely of contiguous memory addresses, the allocated portion comprising one of the first memory allocation and the second memory allocation.

10. The method of claim 8, wherein the requesting a second allocation from the main memory comprises:
determining a testable block size for the main memory;
calculating a number of testable blocks that will fit in the first memory allocation; and
requesting the calculated number of testable blocks of the determined testable block size.

11. The method of claim 8, further comprising:
determining whether the first memory allocation comprises virtual memory;
releasing the first memory allocation in response to the first memory allocation comprising virtual memory; and
requesting the second allocation from the main memory in response to the first memory allocation comprising virtual memory.

12. The method of claim 11, wherein requesting the second portion of the memory comprises:
determining a testable block size for the main of memory;
calculating a number of testable blocks that will fit in the first memory allocation; and
requesting the calculated number of testable blocks of the determined testable block size.

13. The method of claim 12, further comprising requesting a third allocation from the main memory equal to the difference between the first allocation and the second allocation.

14. The method of claim 8, further comprising determining a testable amount of main memory less than the unreserved amount of main memory, wherein requesting the first allocation comprises requesting an amount of the main memory equal to the testable amount of main memory.

15. The method of claim 8, wherein determining whether the first memory allocation comprises non-contiguous memory addresses comprises allocating the first memory allocation into a single buffer.

16. The method of claim 8, wherein identifying an unreserved amount of memory comprises querying an operating system to identify locked areas of the main memory.

17. A program product comprising a non-transitory computer readable storage medium that stores code executable by a processor to perform:
identifying an unreserved amount of main memory in a computer system;
requesting a first allocation the main memory based on the unreserved amount of main memory;
receiving a first memory allocation from the main memory in response to requesting a first allocation of the main memory;
determining whether the first memory allocation comprises non-contiguous memory addresses;
performing a memory diagnostic test on the first memory allocation of the main memory in response to the first memory allocation consisting solely of contiguous memory addresses;
releasing the first memory allocation in response to the first memory allocation comprising non-contiguous memory addresses;
requesting a second allocation from the main memory based on the unreserved amount of main memory in response to the first memory allocation comprising non-contiguous memory addresses, wherein requesting the second allocation from the main memory comprises requesting a smaller amount of the main memory than the first memory allocation; and
performing a memory diagnostic test on a second memory allocation received in response to requesting a second allocation of the main memory.

18. The program product of claim 17, further comprising code to perform:
determining a testable block size for the main memory;
calculating a number of testable blocks that will fit in the first memory allocation; and
requesting the calculated number of testable blocks of the determined testable block size.

19. The program product of claim 17, further comprising code to perform:
locking an allocated portion of the memory in response to the allocated portion consisting solely of contiguous memory addresses, the allocated portion comprising one of the first memory allocation and the second memory allocation.

20. The program product of claim 17, further comprising code to perform:
determining whether the first memory allocation comprises virtual memory;
releasing the first memory allocation in response to the first memory allocation comprising virtual memory; and
requesting the second allocation from the main memory in response to the first memory allocation comprising virtual memory.

* * * * *